United States Patent
Yu et al.

(10) Patent No.: US 9,976,813 B2
(45) Date of Patent: May 22, 2018

(54) HEAT PIPE FIXING STRUCTURE

(71) Applicant: ASIA VITAL COMPONENTS CO., LTD., New Taipei (TW)

(72) Inventors: Ming-Han Yu, New Taipei (TW); Jing-Ning Wu, New Taipei (TW); Sheng-Pei Lee, New Taipei (TH); Chun-Ming Wu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 319 days.

(21) Appl. No.: 14/660,885

(22) Filed: Mar. 17, 2015

(65) Prior Publication Data
US 2016/0278238 A1 Sep. 22, 2016

(51) Int. Cl.
*F28F 7/00* (2006.01)
*F28D 15/02* (2006.01)
*H01L 23/427* (2006.01)

(52) U.S. Cl.
CPC ..... *F28D 15/0275* (2013.01); *F28D 15/0233* (2013.01); *H01L 23/427* (2013.01); *F28F 2275/12* (2013.01)

(58) Field of Classification Search
CPC ........................ F28D 15/0275; H01L 23/427
See application file for complete search history.

(56) References Cited

U.S. PATENT DOCUMENTS 6,408,934 B1 * 6/2002 Ishida ................. F28D 15/0233
165/104.33
9,429,369 B2 * 8/2016 Wu ..................... F28D 15/0275
2007/0261244 A1 * 11/2007 Cheng .................... B21D 39/00
29/890.03
2013/0056179 A1 * 3/2013 Wu ..................... F28D 15/0275
165/104.26
2013/0126125 A1 * 5/2013 Wang ................. F28D 15/0275
165/67
2015/0216081 A1 * 7/2015 Huang ............... H05K 7/20445
165/104.21

FOREIGN PATENT DOCUMENTS

JP          2002286380 A  * 10/2002  ......... F28D 15/0233

OTHER PUBLICATIONS

Hasuo, JP 2002-286380, Oct. 3, 2002, machine translation.*

* cited by examiner

*Primary Examiner* — Hung Q Nguyen
*Assistant Examiner* — Mark L Greene
(74) *Attorney, Agent, or Firm* — Jackson IPG PLLC; Demian K. Jackson

(57) ABSTRACT

A heat pipe fixing structure includes a heat pipe, a carrier body and a first fixing member. The heat pipe has a main body having a first side and a second side. The carrier body has a channel having an open side and a closed side. The heat pipe is disposed in the channel with the first and second sides respectively corresponding to the open side and the closed side. The first fixing member is disposed on upper side of the heat pipe and upper side of the carrier body. A free end of the first fixing member is in corresponding contact with the first side of the heat pipe to press and abut against or engage with the heat pipe. The heat pipe fixing structure serves to firmly fix the heat pipe to eliminate the shortcomings existing in the conventional welding process for fixing the heat pipe.

9 Claims, 16 Drawing Sheets

HEAT PIPE FIXING STRUCTURE

BACKGROUND OF THE INVENTION

1. Field of the Invention

The present invention relates generally to a heat pipe fixing structure, and more particularly to a heat pipe fixing structure, which is able to fixedly connect a heat pipe with a heat dissipation component without welding process.

2. Description of the Related Art

A heat pipe is a tubular body made of copper or aluminum material. Copper and aluminum materials are good heat conductors so that they are widely used as heat conduction components in direct contact with heat source for conducting heat. The heat pipe is generally is passed (stringed) through or engaged with other heat dissipation component to assemble therewith. However, in transfer, the heat pipe is likely to loosen or detached from the heat dissipation component due to shock or vibration. Therefore, in the conventional technique, the heat pipe is often further adhered to the heat dissipation component by means of solder paste or heat conduction paste or further combined with the heat dissipation component by means of welding. However, the heat pipe is made of copper or aluminum material. Due to the material properties of copper or aluminum, it is still hard to fixedly adhere or connect the heat pipe to the heat dissipation component by means of the solder paste or common welding. In addition, after welded, the heat pipe has the problems of thermal resistance and environmental protection.

Alternatively, in the conventional technique, the heat pipe can be assembled with other heat dissipation component by means of press fit. The heat pipe and the heat dissipation component can be fixed with each other by means of press fit. However, the press fit structure will partially apply pressure to the heat pipe to cause deformation of the heat pipe. As a result, the capillary structure inside the heat pipe will be damaged to greatly deteriorate the heat conductivity of the heat pipe or even disable the heat pipe. In this case, the heat pipe will lose its heat transfer effect. It is therefore tried by the applicant to provide a heat pipe fixing structure to solve the problems existing in the conventional technique.

SUMMARY OF THE INVENTION

It is therefore a primary object of the present invention to provide a heat pipe fixing structure, which is able to securely fix the heat pipe.

To achieve the above and other objects, the heat pipe fixing structure of the present invention includes a heat pipe, a carrier body and a first fixing member.

The heat pipe has a main body. The main body has a first side and a second side. The carrier body has a channel. The channel has an open side and a closed side. The heat pipe is disposed in the channel with the first and second sides of the heat pipe respectively corresponding to the open side and the closed side. The first fixing member is disposed on upper side of the heat pipe and upper side of the carrier body. One end of the first fixing member is in corresponding contact with the first side of the heat pipe.

The heat pipe fixing structure of the present invention is able to overcome the shortcomings of the conventional welding process and press fit structure and effectively and securely assemble the heat pipe with other heat dissipation component.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
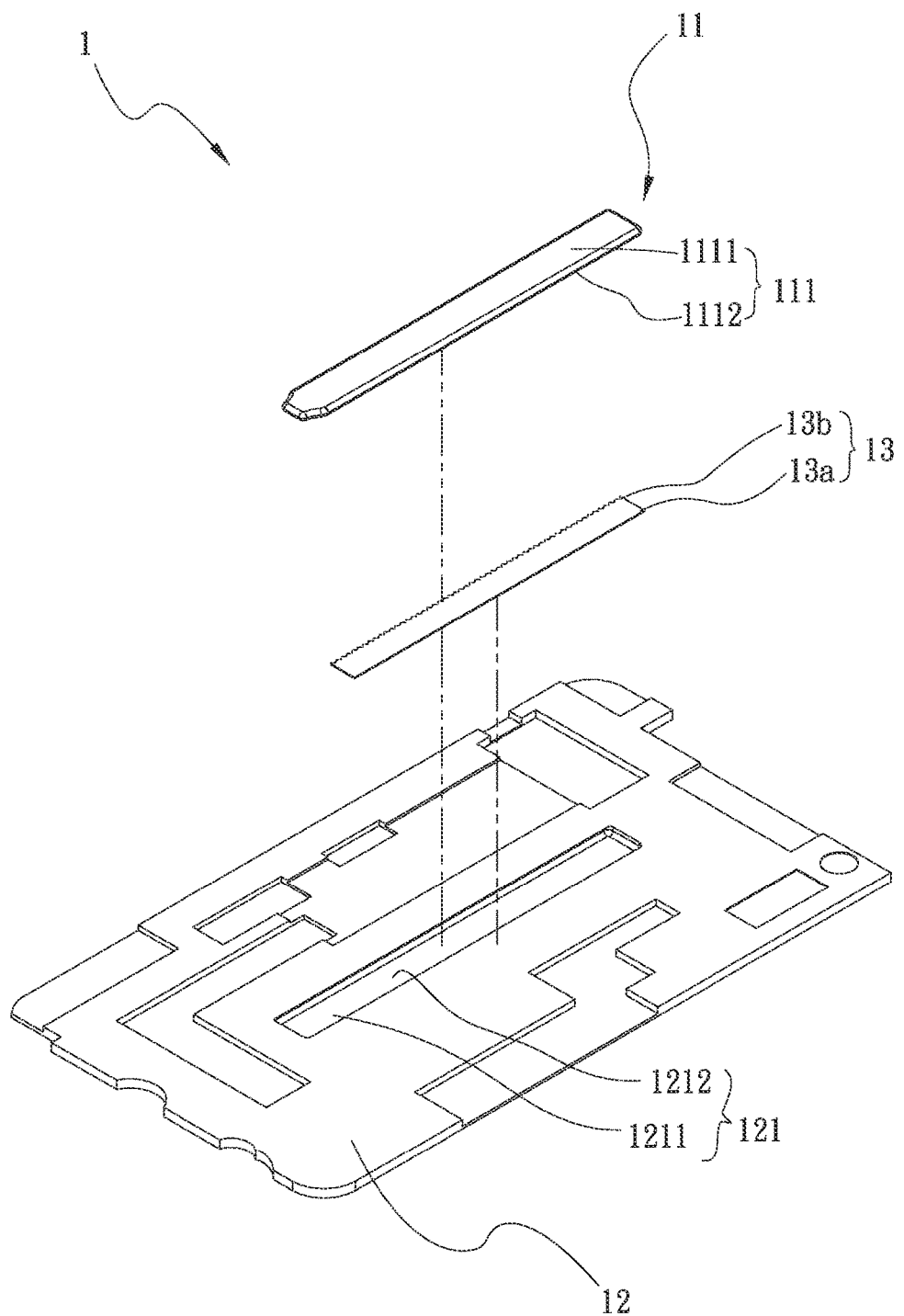
FIG. 1 is a perspective exploded view of a first embodiment of the heat pipe fixing structure of the present invention.
Figure 2:
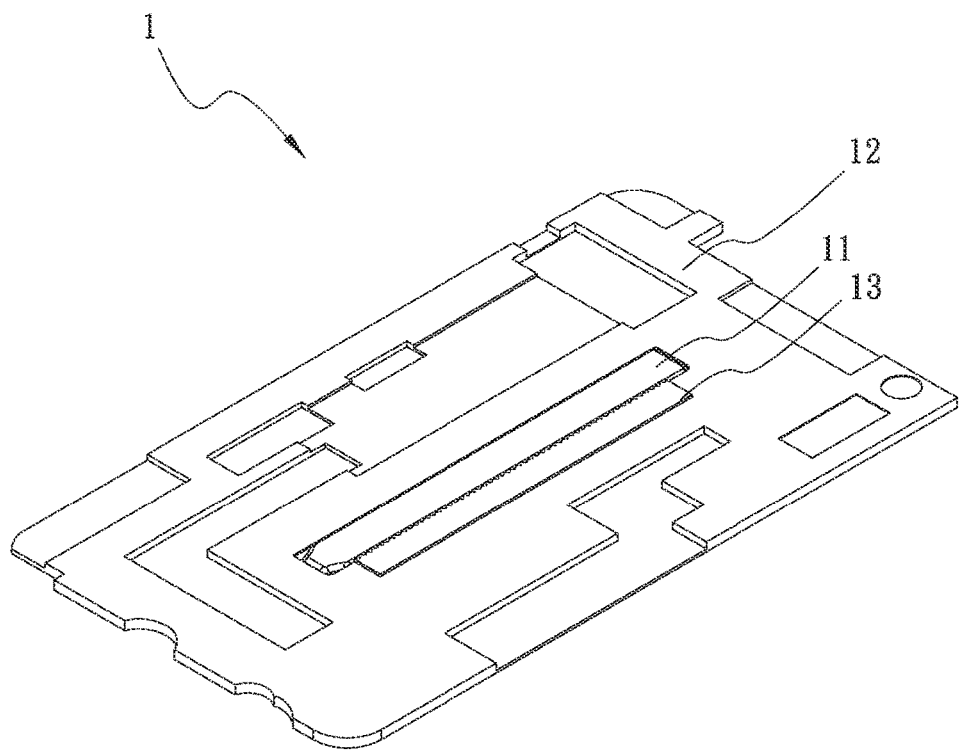
FIG. 2 is a perspective assembled view of the first embodiment of the heat pipe fixing structure of the present invention.
Figure 3:
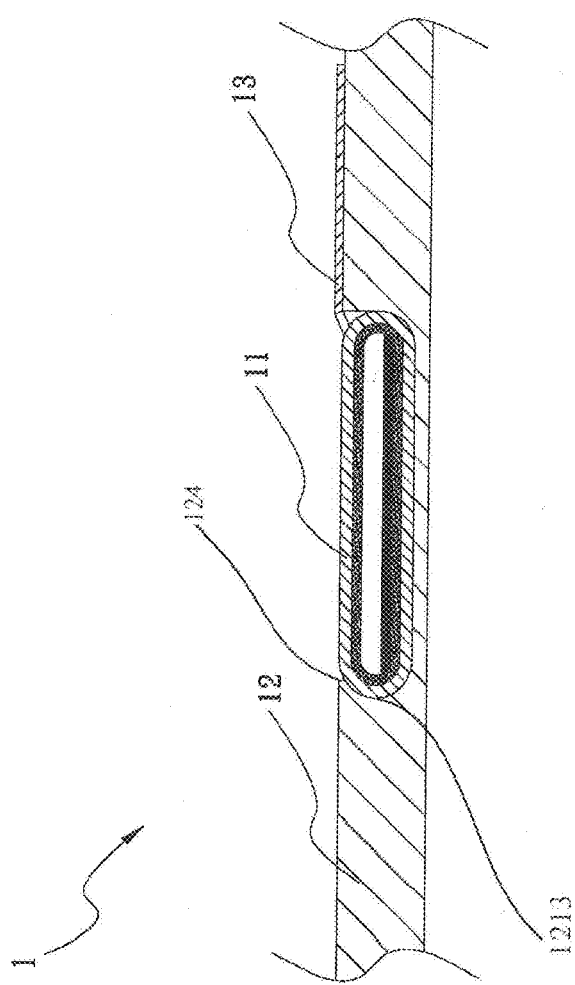
FIG. 3 is a sectional assembled view of the first embodiment of the heat pipe fixing structure of the present invention.

Please refer to FIGS. 1, 2 and 3. FIG. 1 is a perspective exploded view of a first embodiment of the heat pipe fixing structure of the present invention. FIG. 2 is a perspective assembled view of the first embodiment of the heat pipe fixing structure of the present invention. FIG. 3 is a sectional assembled view of the first embodiment of the heat pipe fixing structure of the present invention. According to the first embodiment, the heat pipe fixing structure 1 of the present invention includes a heat pipe 11, a carrier body 12 and a first fixing member 13.

The heat pipe 11 has a main body 111. The heat pipe 11 has a flat configuration and extends axially. The main body 111 has a first side 1111 and a second side 1112. The first and second sides 1111, 1112 are oppositely formed on upper and lower sides of the main body 111 of the heat pipe 11.

The carrier body 12 has a channel 121, a protruded fixed part 124, and a recess 1213 formed in an inner wall of the channel. The channel 121 has an open side 1211 and a closed side 1212. The heat pipe 11 is disposed in the channel 121 with the first and second sides 1111, 1112 of the heat pipe 11 respectively corresponding to the open side 1211 and the closed side 1212. That is, the first side 1111 corresponds to the open side 1211, while the second side 1112 correspondingly attaches to the closed side 1212.

The carrier body 12 is selected from a group consisting of heat dissipation chassis, cellular phone frame, heat sink, vapor chamber and intelligent tablet frame. In this embodiment, the carrier body 12 is, but not limited to, cellular phone frame for illustration purposes only.

The first fixing member 13 is disposed on upper side of the heat pipe 11 and upper side of the carrier body 12. The first fixing member 13 has a fixed end 13a disposed on left side or right side of upper side of the heat pipe 11. The first fixing member 13 further has a free end 13b protruding to the channel 121. The first fixing member 13 serves to press (and abut against) the heat pipe 11 to fix the same.

Figure 4:
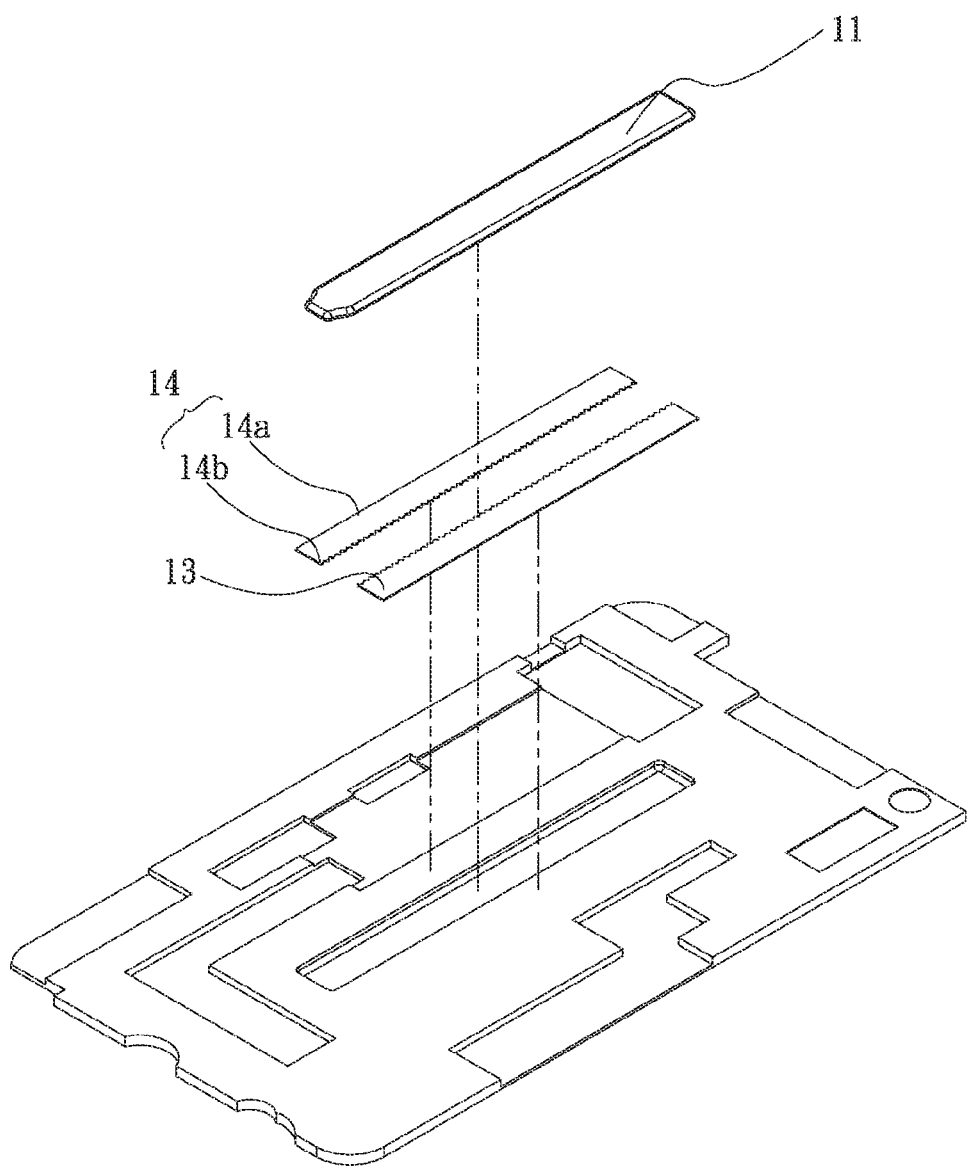
FIG. 4 is a perspective exploded view of a second embodiment of the heat pipe fixing structure of the present invention.
Figure 5:
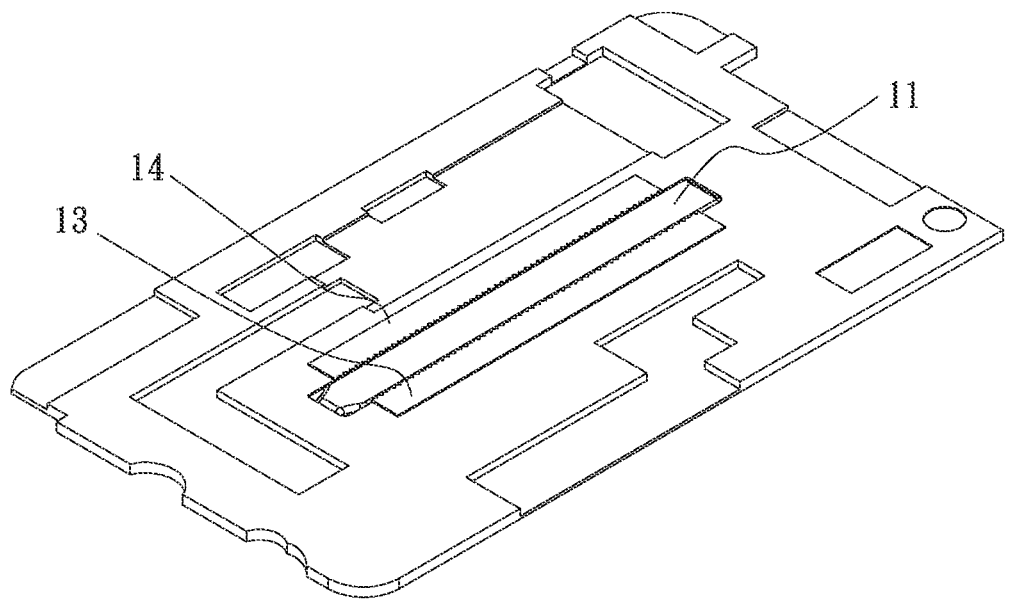
FIG. 5 is a perspective assembled view of the second embodiment of the heat pipe fixing structure of the present invention.

Please now refer to FIGS. 4 and 5. FIG. 4 is a perspective exploded view of a second embodiment of the heat pipe fixing structure of the present invention. FIG. 5 is a perspective assembled view of the second embodiment of the heat pipe fixing structure of the present invention. The second embodiment is partially identical to the first embodiment in structure and technical characteristic and thus will not be repeatedly described hereinafter. The second embodiment is different from the first embodiment in that the second embodiment further includes a second fixing member 14. The first and second fixing members 13, 14 are oppositely arranged and respectively disposed on left side and right side of upper side of the heat pipe 11. The second fixing member 14 has a fixed end 14a and a free end 14b.

Figure 6:
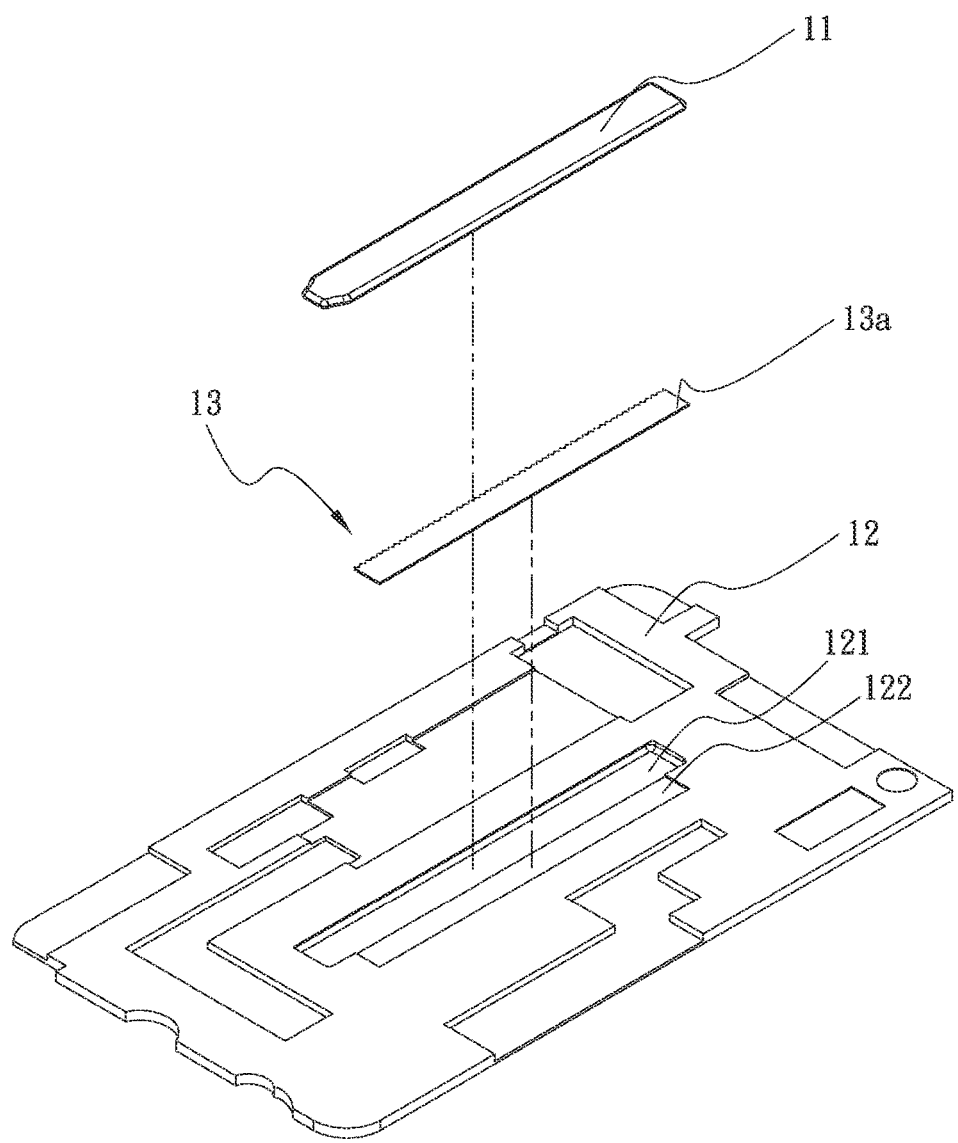
FIG. 6 is a perspective exploded view of a third embodiment of the heat pipe fixing structure of the present invention.
Figure 7:
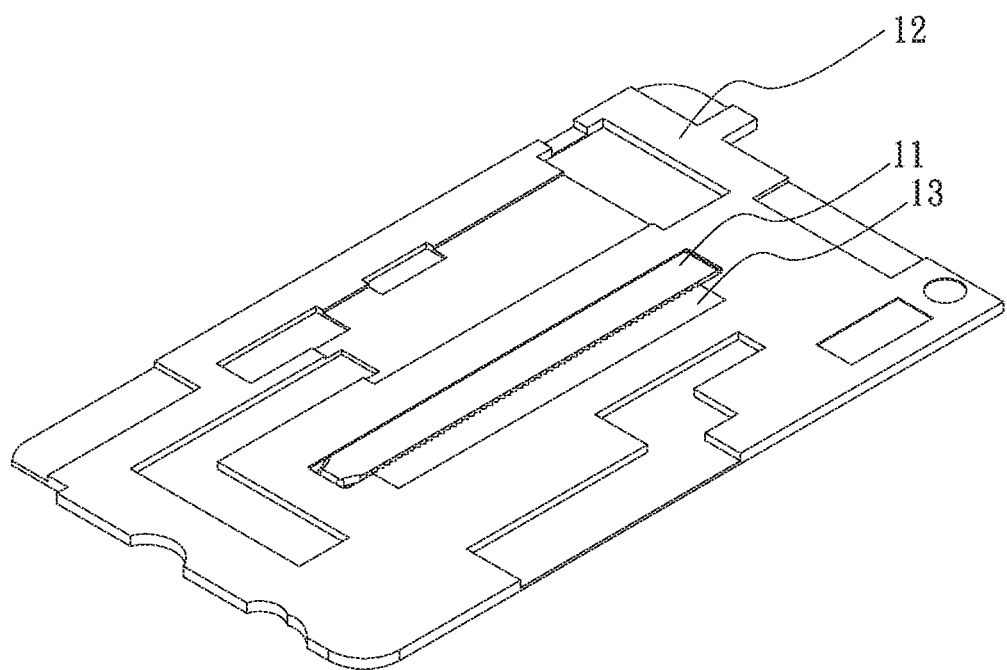
FIG. 7 is a perspective assembled view of the third embodiment of the heat pipe fixing structure of the present invention.

Please now refer to FIGS. 6 and 7. FIG. 6 is a perspective exploded view of a third embodiment of the heat pipe fixing structure of the present invention. FIG. 7 is a perspective assembled view of the third embodiment of the heat pipe fixing structure of the present invention. The third embodiment is partially identical to the first embodiment in structure and technical characteristic and thus will not be repeatedly described hereinafter. The third embodiment is different from the first embodiment in that the carrier body 12 further has a first recess 122. The first fixing member 13 is disposed in the first recess 122. The first recess 122 is disposed on a lateral side of upper side of the channel 121 in communication with the channel 121. That is, the first recess 122 is correspondingly formed on the carrier body 12 and disposed on the lateral side of upper side of the channel 121. The fixed end 13a of the first fixing member 13 is correspondingly disposed or engaged in the first recess 122 to further fix the first fixing member 13.

Figure 8:
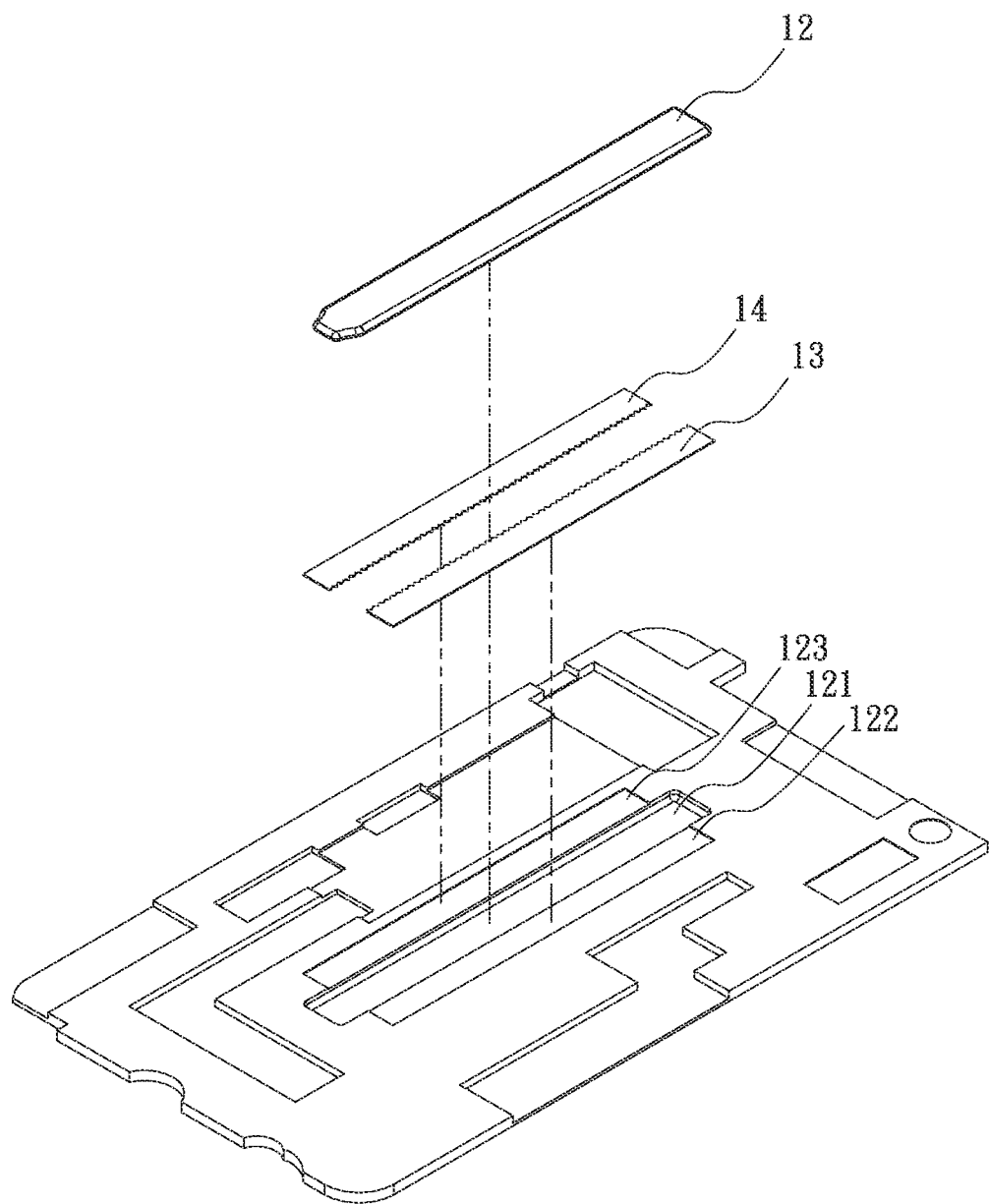
FIG. 8 is a perspective exploded view of a fourth embodiment of the heat pipe fixing structure of the present invention.
Figure 9:
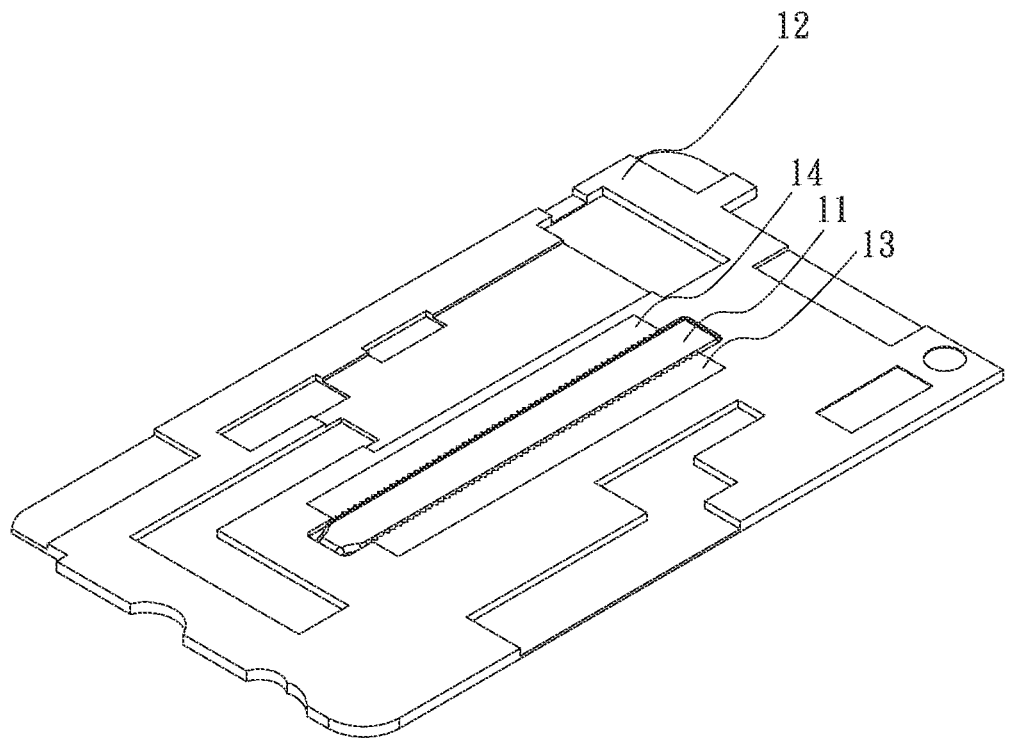
FIG. 9 is a perspective assembled view of the fourth embodiment of the heat pipe fixing structure of the present invention.

Please now refer to FIGS. 8 and 9. FIG. 8 is a perspective exploded view of a fourth embodiment of the heat pipe fixing structure of the present invention. FIG. 9 is a perspective assembled view of the fourth embodiment of the heat pipe fixing structure of the present invention. The fourth embodiment is partially identical to the second embodiment in structure and technical characteristic and thus will not be repeatedly described hereinafter. The fourth embodiment is different from the second embodiment in that the carrier body 12 further has a first recess 122 and a second recess 123. The first and second fixing members 13, 14 are respectively disposed in the first and second recesses 122, 123. The first and second recesses 122, 123 are disposed on left side and right side of upper side of the channel 121 in communication with the channel 121. That is, the first and second recesses 122, 123 are correspondingly formed on the carrier body 12 and disposed on the left and right sides of upper side of the channel 121. The first and second fixing members 13, 14 are respectively correspondingly disposed or engaged in the first and second recesses 122, 123 to further fix the first and second fixing members, 13, 14.

Figure 10:
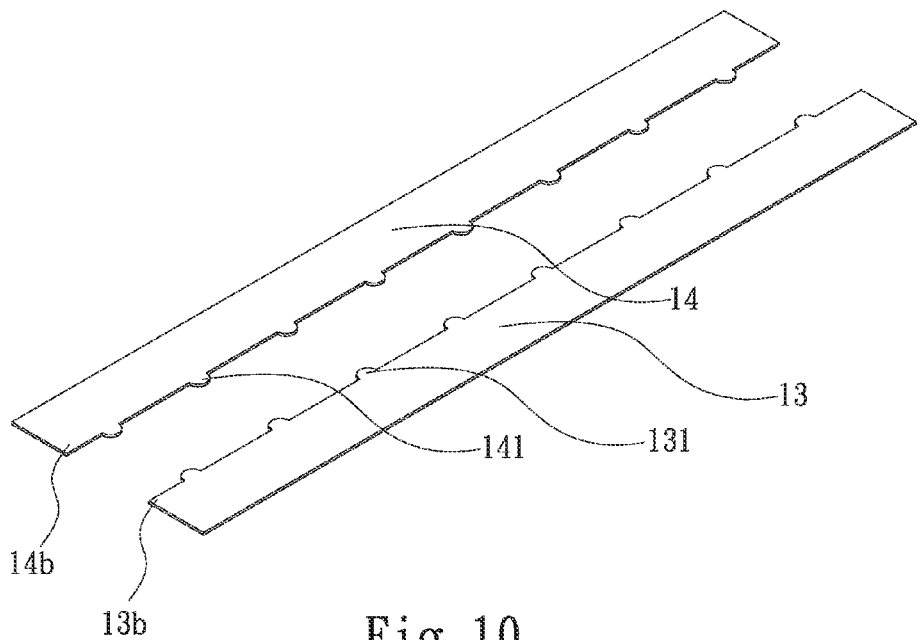
FIG. 10 is a perspective view of the first and second fixing members of the heat pipe fixing structure of the present invention.
Figure 11:
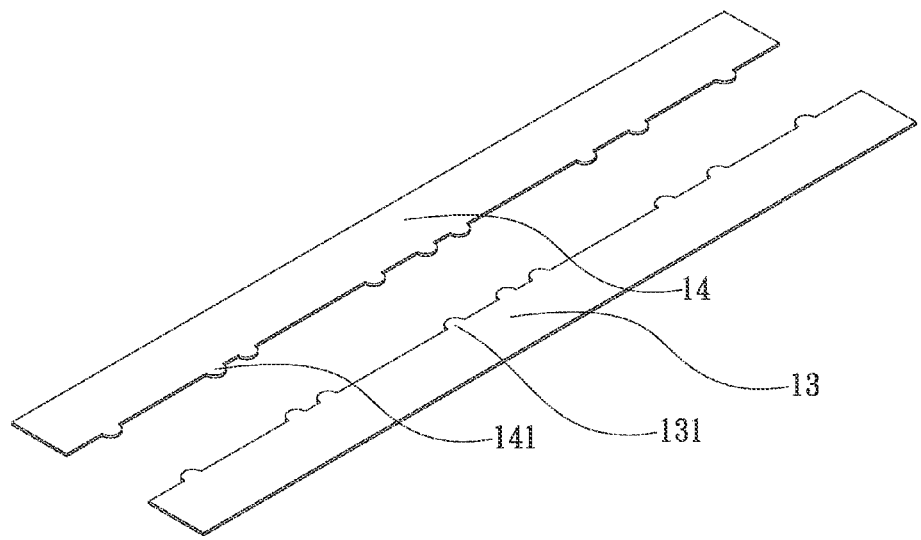
FIG. 11 is a perspective view of the first and second fixing members of the heat pipe fixing structure of the present invention.

Please now refer to FIGS. 10 and 11. FIG. 10 is a perspective view of the first and second fixing members of the heat pipe fixing structure of the present invention. FIG. 11 is a perspective view of the first and second fixing members of the heat pipe fixing structure of the present invention. The free ends 13b, 14b of the first and second fixing members 13, 14 are formed with multiple protrusions 131, 141. The protrusions 131, 141 are arranged at equal intervals (as shown in FIG. 10) or at unequal intervals (as shown in FIG. 11).

Figure 12:
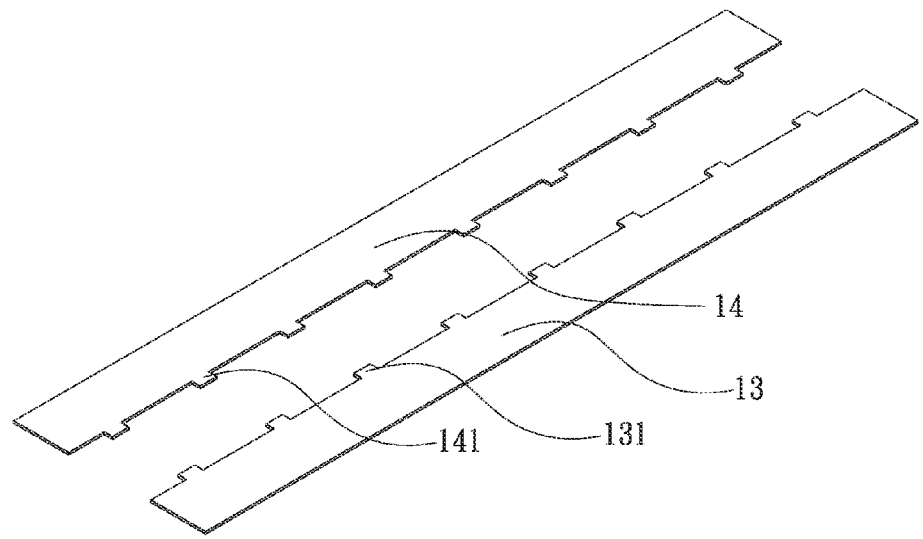
FIG. 12 is a perspective view of the first and second fixing members of the heat pipe fixing structure of the present invention.
Figure 13:
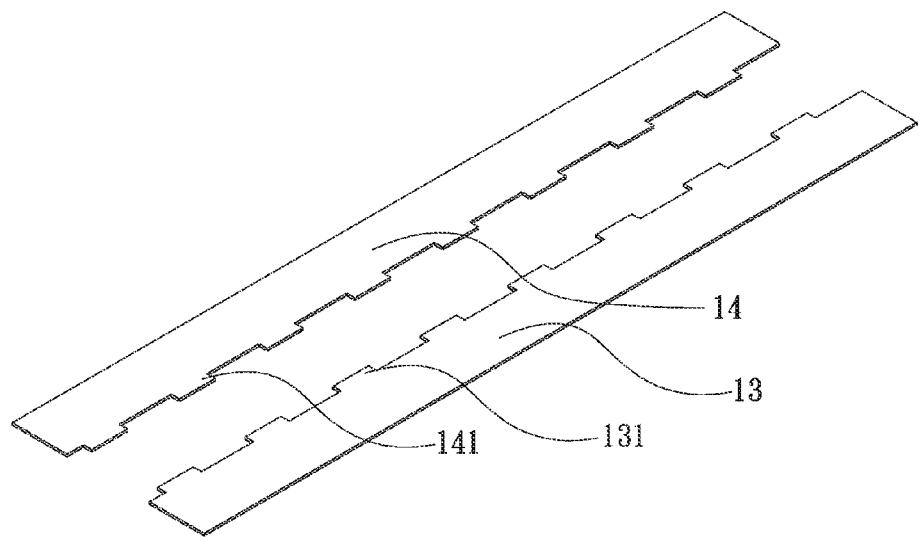
FIG. 13 is a perspective view of the first and second fixing members of the heat pipe fixing structure of the present invention.
Figure 14:
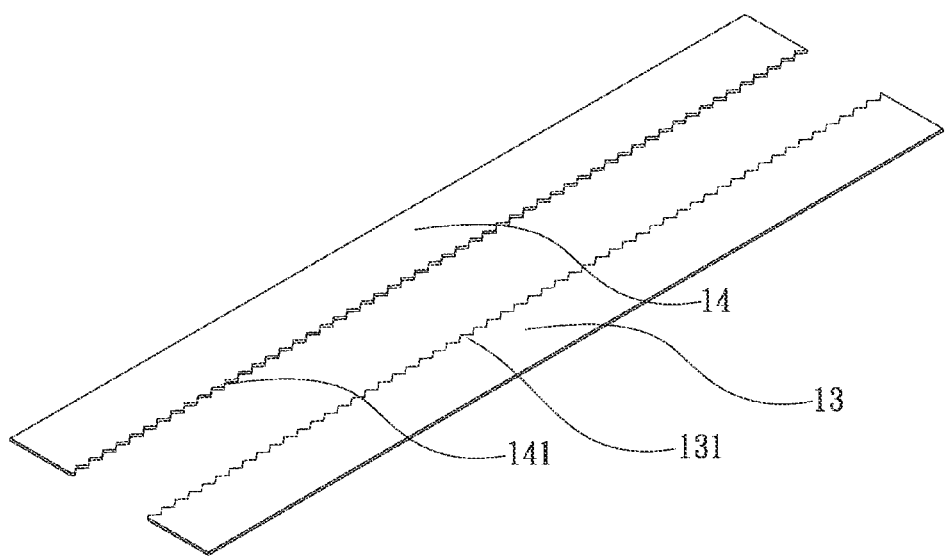
FIG. 14 is a perspective view of the first and second fixing members of the heat pipe fixing structure of the present invention.
Figure 15:
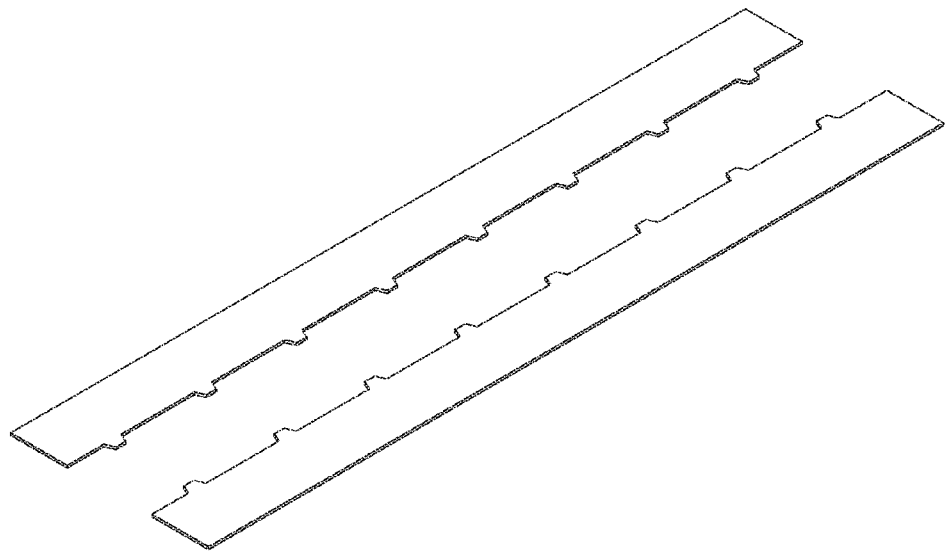
FIG. 15 is a perspective view of the first and second fixing members of the heat pipe fixing structure of the present invention.

Please now refer to FIGS. 12, 13, 14 and 15. FIG. 12 is a perspective view of the first and second fixing members of the heat pipe fixing structure of the present invention. FIG. 13 is a perspective view of the first and second fixing members of the heat pipe fixing structure of the present invention. FIG. 14 is a perspective view of the first and second fixing members of the heat pipe fixing structure of the present invention. FIG. 15 is a perspective view of the first and second fixing members of the heat pipe fixing structure of the present invention. The protrusions 131, 141 of the first and second fixing members 13, 14 have a semicircular form (as shown in FIG. 10), square form (as shown in FIG. 12), rectangular form (as shown in FIG. 13), triangular form (as shown in FIG. 14), trapezoidal form (as shown in FIG. 15) or any other geometrical form.

Figure 16:
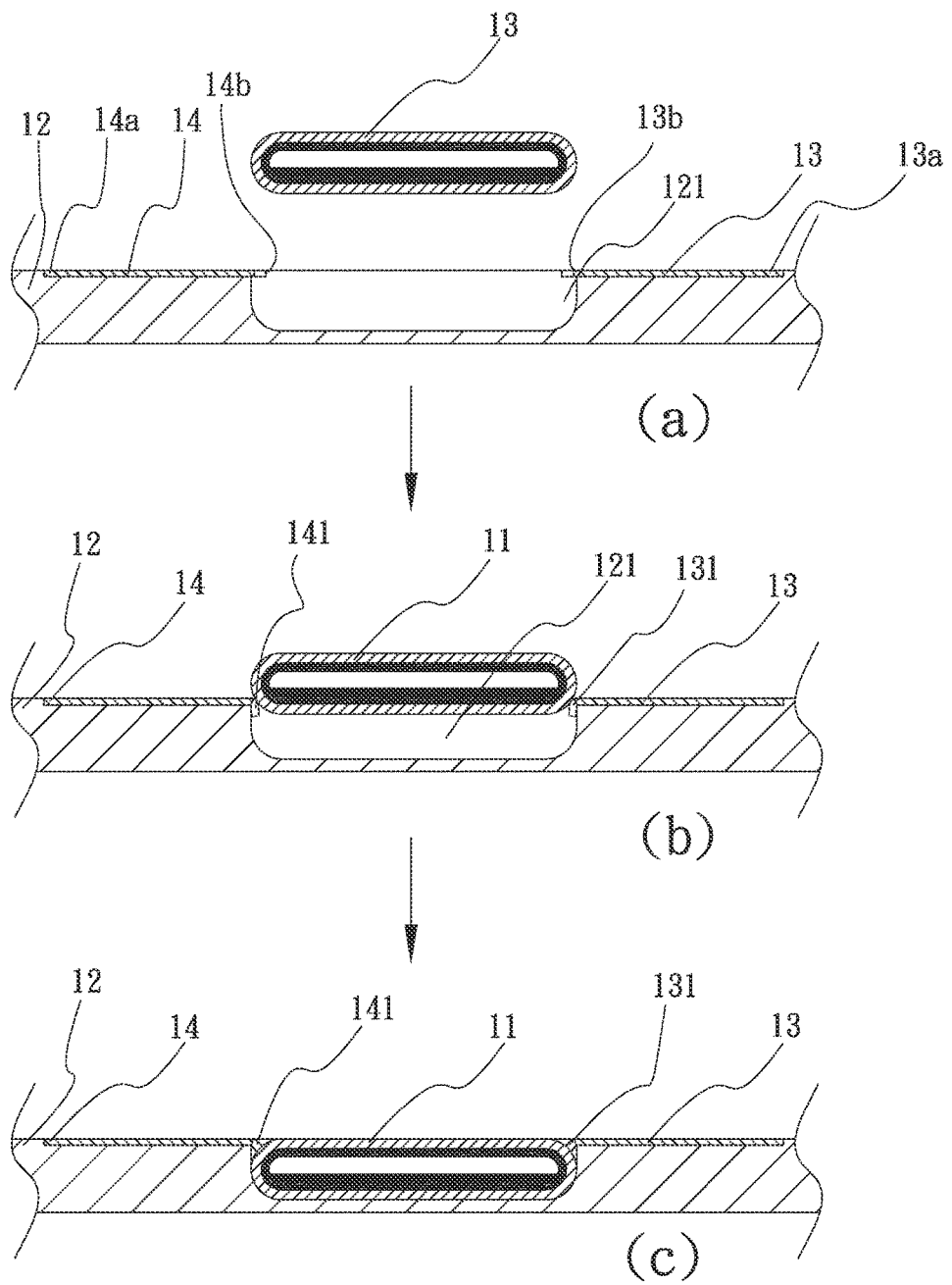
FIG. 16 show the assembling process of the heat pipe fixing structure of the present invention.

Please now refer to FIG. 16, which shows the assembling process of steps (a)-(c) of the heat pipe fixing structure of the present invention. As shown in the drawings, the first and second fixing members 13, 14 are previously mounted on the carrier body 12 with the fixed ends 13a, 14a positioned on the left and right sides of upper side of the channel 121. The heat pipe 11 is placed into the channel 121 through the space between the first and second fixing members 13, 14 in a direction normal to the channel 121 (as shown in step (a) of FIG. 16). When the heat pipe 11 passes through the space between the first and second fixing members 13, 14, the heat pipe 11 makes the protrusions 131, 141 of the free ends 13b, 14b of the first and second fixing members 13, 14 elastically deform (as shown in step (b) of FIG. 16). After the heat pipe 11 passes through the space between the first and second fixing members 13, 14, the protrusions 131, 141 elastically rebound to press the heat pipe 11 and fix the heat pipe 11 in the channel 121 of the carrier body 12 (as shown in step (c) of FIG. 16). Under such circumstance, the heat pipe 11 is pressed and fixed by the first and second fixing members 13, 14.

Figure 17:
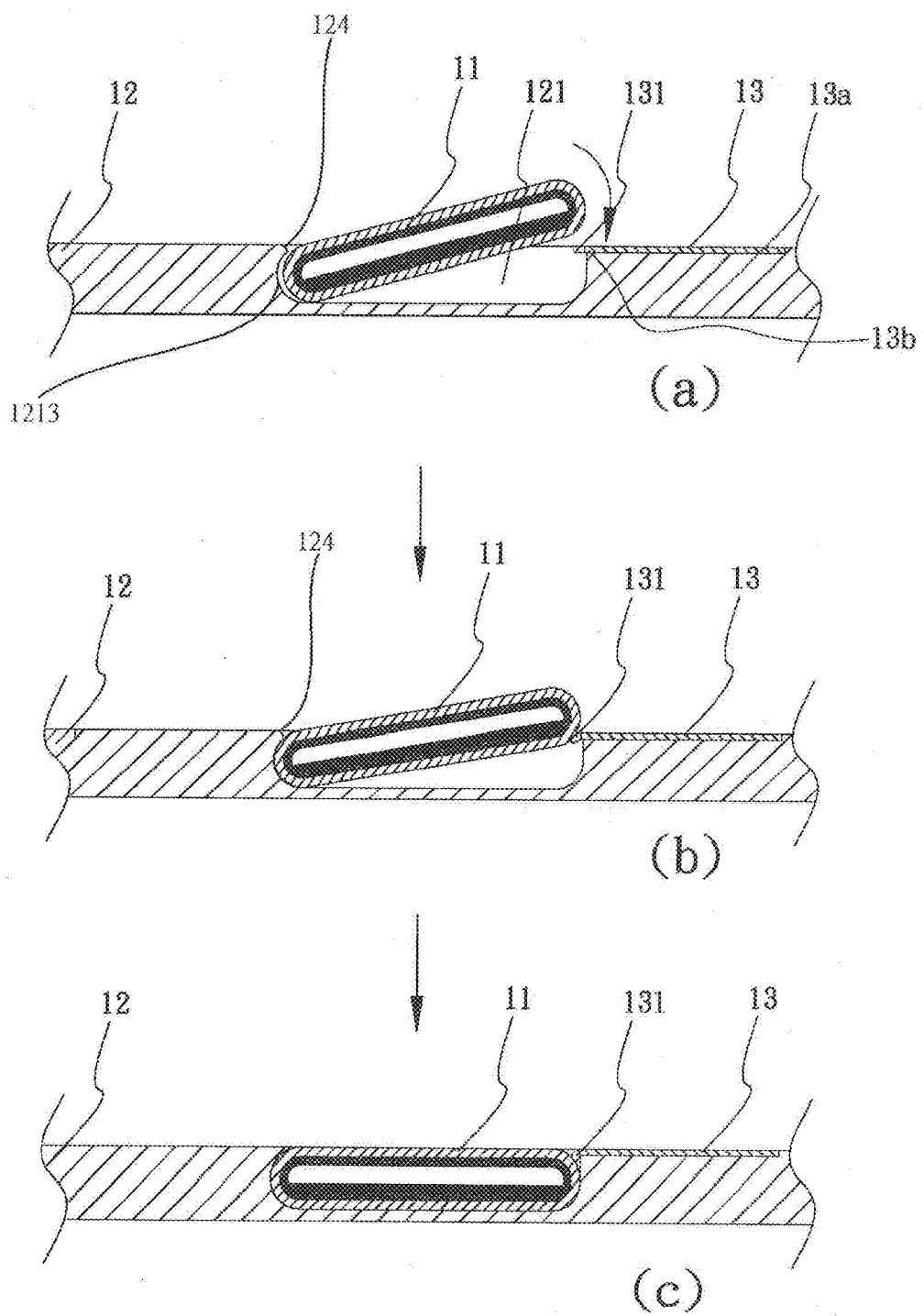
FIG. 17 show the assembling process of the heat pipe fixing structure of the present invention.

Please now refer to FIG. 17, which shows the assembling process of the heat pipe fixing structure of the present invention. As shown in the drawings, via the fixed end 13a, the first fixing member 13 is mounted on the upper side of the channel 121 of the carrier body 12. A first lateral side of the heat pipe 11 is obliquely placed into the channel 121 to abut against the recess 1213 (as shown in step (a) of FIG. 17). The other lateral side of the heat pipe 11 downward presses the protrusions 131 of the first fixing member 13 and forcedly passes through the protrusions 131 of the first fixing member 13 to move into the channel 121. When the other lateral side of the heat pipe 11 downward presses the protrusions 131 of the first fixing member 13 and passes through the free end 13b of the first fixing member 13, the free end 13b of the first fixing member 13 elastically deforms (as shown in step (b) of FIG. 17). After the heat pipe 11 passes through the free end 13b, the free end 13b elastically rebound to press the heat pipe 11 and fix the heat pipe 11 in the channel 121 of the carrier body 12 (as shown in step (c) of FIG. 17).

Figure 18:
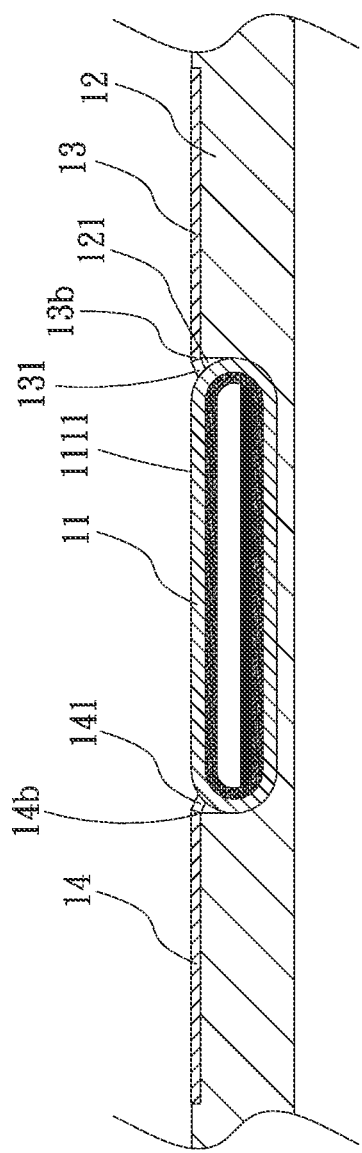
FIG. 18 is a sectional assembled view of a fifth embodiment of the heat pipe fixing structure of the present invention.

Please now refer to FIG. 18, which is a sectional assembled view of a fifth embodiment of the heat pipe fixing structure of the present invention. The fifth embodiment is partially identical to the second embodiment in structure and thus will not be repeatedly described hereinafter. The fifth embodiment is different from the second embodiment in that when the heat pipe 11 is forced into the channel 121, the protrusions 131, 141 of the first and second fixing members 13, 14 are elastically deformed and inclined from the first and second fixing members 13, 14. In addition, the free ends of the protrusions 131, 141 of the first and second fixing members 13, 14 abut against the first side 1111 of the heat pipe 11.

Figure 19:
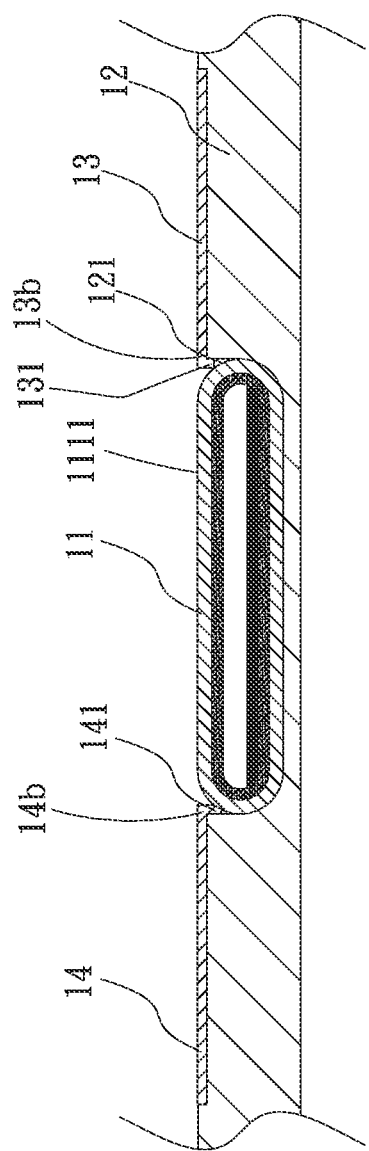
FIG. 19 is a sectional assembled view of a sixth embodiment of the heat pipe fixing structure of the present invention.

Please now refer to FIG. 19, which is a sectional assembled view of a sixth embodiment of the heat pipe fixing structure of the present invention. The sixth embodiment is partially identical to the first embodiment in structure and thus will not be repeatedly described hereinafter. The sixth embodiment is different from the first embodiment in that when the heat pipe 11 is forced into the channel 121, the free ends 13b, 14b of the first and second fixing members 13, 14 are elastically deformed and the protrusions 131, 141 of the first and second fixing members 13, 14 are normal to the first and second fixing members 13, 14. The free ends of the protrusions 131, 141 of the free ends 13b, 14b of the first and second fixing members 13, 14 abut against the edges of the first side 1111 of the heat pipe 11 to tightly engage with the heat pipe 11.

The present invention has been described with the above embodiments thereof and it is understood that many changes and modifications in the above embodiments can be carried out without departing from the scope and the spirit of the invention that is intended to be limited only by the appended claims.

What is claimed is:

1. A heat pipe fixing structure comprising:
   a heat pipe having a main body having a first side, a second side opposite the first side, and a lateral third side;
   a carrier body having a channel, the channel having an open first side, a closed second side opposite the open first side, and a lateral wall, the lateral wall having a protruded fixed part at the open first side and a recess under the protruded fixed part, the heat pipe being disposed in the channel with the lateral third side within the recess and with the first side and the second side of the heat pipe respectively corresponding to the open first side and the closed second side of the channel; and
   a first fixing member comprising a fixed portion disposed on an upper surface of the carrier body and multiple protrusions horizontally extending from a long edge of the fixed portion over the channel so as to contact the first side of the heat pipe, such that only the protrusions of the first fixing member press and abut against the heat pipe to fix the same;
   wherein the protrusions extend only partially over a width of the heat pipe.

2. The heat pipe fixing structure as claimed in claim 1, wherein the protrusions have a semicircular form, square form, rectangular form, triangular form or trapezoidal form.

3. The heat pipe fixing structure as claimed in claim 1, wherein the carrier body further has a second recess, the first fixing member being disposed in the second recess, the second recess being in communication with the channel and disposed on a lateral side of the open first side of the channel.

4. The heat pipe fixing structure as claimed in claim 1, wherein the heat pipe has a flat configuration.

5. The heat pipe fixing structure as claimed in claim 1, wherein the carrier body is selected from a group consisting of a heat dissipation chassis, a cellular phone frame, a heat sink and a vapor chamber.

6. The heat pipe fixing structure of claim 1, wherein the protrusions extend transverse to a long axis of the heat pipe.

7. The heat pipe fixing structure of claim 1, wherein the lateral third side of the heat pipe is a curved lateral third side of the main body, the main body further comprising a curved lateral fourth side opposite the curved lateral third side.

8. The heat pipe fixing structure of claim 7, wherein the curved lateral third side and the curved lateral fourth side of the heat pipe are each convex.

9. The heat pipe fixing structure of claim 1, wherein the multiple protrusions are elastic.

* * * * *